US010175273B2

(12) United States Patent
Pulkkinen et al.

(10) Patent No.: US 10,175,273 B2
(45) Date of Patent: Jan. 8, 2019

(54) METHOD OF USING POWER GRID AS LARGE ANTENNA FOR GEOPHYSICAL IMAGING

(71) Applicants: Antti A. Pulkkinen, University Park, MD (US); Todd M. Bonalsky, Fords, NJ (US); Troy Ames, Laurel, MD (US); Carl F. Hostetter, Crofton, MD (US)

(72) Inventors: Antti A. Pulkkinen, University Park, MD (US); Todd M. Bonalsky, Fords, NJ (US); Troy Ames, Laurel, MD (US); Carl F. Hostetter, Crofton, MD (US)

(73) Assignee: The United States of America as represented by the Administrator of NASA, Washington, DC (US)

( * ) Notice: Subject to any disclaimer, the term of this patent is extended or adjusted under 35 U.S.C. 154(b) by 561 days.

(21) Appl. No.: 14/856,090

(22) Filed: Sep. 16, 2015

(65) Prior Publication Data

US 2017/0074910 A1    Mar. 16, 2017

(51) Int. Cl.
*G01R 19/165* (2006.01)
*H04B 7/0408* (2017.01)
*G01R 31/02* (2006.01)

(52) U.S. Cl.
CPC ......... *G01R 19/165* (2013.01); *G01R 31/021* (2013.01)

(58) Field of Classification Search
CPC .................... G01R 19/165; G01R 31/021

USPC .... 324/126, 500, 89, 508, 510, 511, 764.01, 324/600, 76.11, 323, 329, 332, 616, 637, 324/639, 76.35, 76.54, 95; 375/260, 295, 375/268, 300, 133, 146
See application file for complete search history.

(56) References Cited

U.S. PATENT DOCUMENTS

| 9,383,397 B1* | 7/2016 | McEachern ............ G01R 15/00 |
| 2017/0092055 A1* | 3/2017 | Brockman .......... G07F 17/3225 |

* cited by examiner

*Primary Examiner* — Melissa Koval
*Assistant Examiner* — Trung Nguyen
(74) *Attorney, Agent, or Firm* — Matthew F. Johnston; Bryan A. Geurts; Mark P. Dvorscak

(57) ABSTRACT

A high-voltage power transmission system is used as an extremely large antenna to extract spatiotemporal space, physical, and geological information from geomagnetically induced currents (GIC). A differential magnetometer method is used to measure GIC and involves acquiring line measurements from a first fluxgate magnetometer under a high-voltage transmission line, acquiring natural field measurements from a reference magnetometer nearby but not under the transmission line, subtracting the natural field measurements from the line measurements, and determining the GIC-related Biot-Savart field from the difference. NASA warning and alarm systems can be triggered based on determinations of GIC amplitude levels that exceed a set threshold value.

10 Claims, 5 Drawing Sheets

METHOD OF USING POWER GRID AS LARGE ANTENNA FOR GEOPHYSICAL IMAGING

STATEMENT REGARDING FEDERALLY SPONSORED RESEARCH OR DEVELOPMENT

The invention described herein was made in part by employees of the United States Government and may be manufactured and used by or for the Government of the United States of America for governmental purposes without the payment of any royalties thereon or therefore.

FIELD OF THE INVENTION

The present invention relates to a high-voltage power transmission system and methods of detecting near space geomagnetic phenomena.

BACKGROUND OF THE INVENTION

Geomagnetically induced currents (GIC) carry information about near space phenomena, which is of NASA science interest. GIC can be harmful to the power grid and thus the information is valuable also for the transmission system operators.

When magnetic fields move about in the vicinity of a conductor such as a high-voltage power transmission line, a GIC is produced in the conductor. This happens on a large scale during geomagnetic storms on practically all long transmission lines. Long power transmission lines, for example, of many kilometers in length, are subject to damage by the GIC effect, especially in more modern high-voltage, low-resistance lines.

The nearly direct currents induced in high-voltage power transmission lines from geomagnetic storms are harmful to electrical transmission equipment, especially transformers. Such induced currents can induce core saturation, constrain transformer performance, trip various safety devices, and cause coils and cores to heat up. In some cases heat generated can disable or destroy a transformer, or even induce a chain reaction that can overload transformers throughout a system. A faulty transformer can also affect a linked generator by acting as an unbalanced load to a generator, causing negative sequence current in the stator and consequently heating of the rotor.

SUMMARY OF THE INVENTION

According to various embodiments of the present invention, two magnetometer stations can be used to determine geomagnetically induced current (GIC) flow along a high-voltage power transmission line, and a vast network of many pairs of such stations is provided. By subtracting reference magnetic field observations from line observations, the configuration will provide a differential field that will contain only the signal associated with GIC. The differential field will allow determination of GIC flowing in the transmission line. Each pair of stations will wirelessly transmit to a central processing station, over a cell phone network, satellite network, or a combination thereof, data pertaining to the local measurements. Each station can operate autonomously and the central processing station can process all of the local data into information pertaining to near space phenomena, such that the electrical power grid including the high-voltage power transmission lines acts as a large antenna.

According to various embodiments of the present invention, a high-voltage power transmission system is used as an extremely large antenna to extract spatiotemporal space, physical, and geological information from GIC. The differential magnetometer method can involve acquiring line measurements from a first fluxgate magnetometer under a high-voltage transmission line, acquiring natural field measurements from a reference magnetometer nearby but not under the transmission line, subtracting the natural field measurements from the line measurements, and determining the GIC-related Biot-Savart field from the difference. NASA warning and alarm systems can be triggered based on determinations of GIC levels that exceed a set threshold value.

According to one or more embodiments of the present invention, a low-cost, autonomous magnetometer station and large scale application are used to provide information about geomagnetic storms and their effect on scientific instruments and readings, and their effect on a high-voltage power transmission system. The system and method capitalize on the fact that geomagnetic storms drive GIC in high-voltage power transmission systems. GIC thus carry information about the near space environment conditions. A large high-voltage power transmission system, such as the United States high-voltage power transmission system, can be used as an extremely large antenna to extract unprecedented spatiotemporal space, physical, and geological information from distributed GIC observations. Directional and strength information can be determined by measuring GIC at many different locations.

BRIEF DESCRIPTION OF THE DRAWINGS

The present invention can be even more fully understood with the reference to the accompanying drawings which are intended to illustrate, not limit, the present invention.

DETAILED DESCRIPTION OF THE INVENTION

Figure 1A:
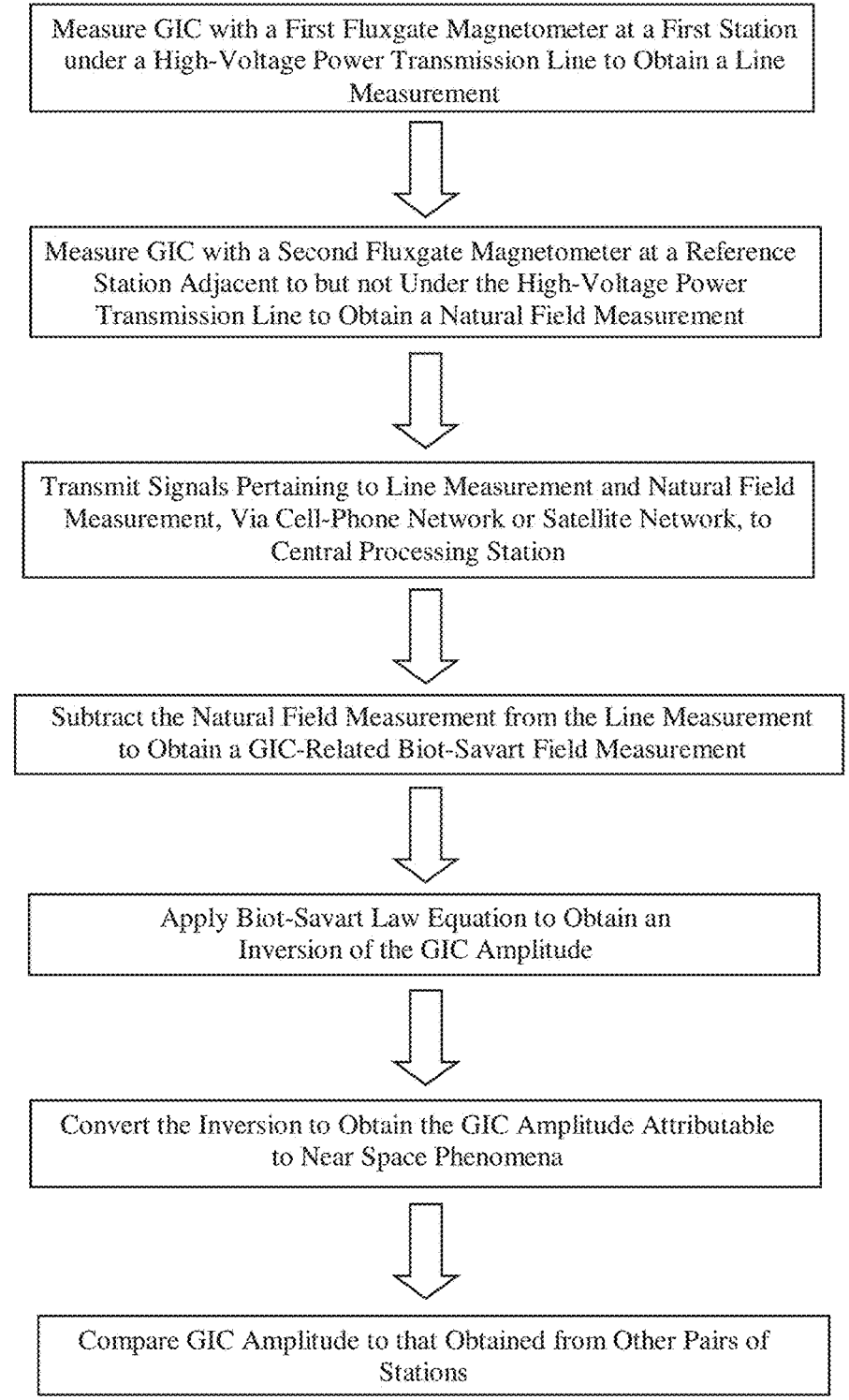
FIG. 1A is a flow chart showing various method steps involved with determining the amplitude of GIC, due to near space phenomena, in a high-voltage power transmission line, according to various embodiments of the present invention.

According to various embodiments of the present invention, a method of determining the amplitude of a geomagnetically induced current (GIC) in a high-voltage power transmission line, due to near space phenomena, is provided. The method can comprise measuring GIC with a first fluxgate magnetometer at a first magnetometer station under a high-voltage power transmission line, to obtain a GIC line measurement. The first magnetometer station can be located on a platform immediately below the high-voltage power transmission line, or located on the ground directly underneath the high-voltage power transmission line. The first magnetometer station can be positioned, for example, five feet below, 10 feet below, 20 feet below, 50 feet below, or 100 feet below the high-voltage power transmission line. The first magnetometer station can be attached to a support pole or structure supporting the high-voltage power transmission line. A second fluxgate magnetometer can be used to measure GIC at a reference magnetometer station adjacent to, but not under, the high-voltage power transmission line, to obtain a natural field measurement. As an example, the reference magnetometer station can be positioned about one mile or more away, perpendicularly, from the high-voltage power transmission line, or about one kilometer away, or about one-half of a mile away, or about one-quarter of a mile away, or at least about 1000 feet away. The reference magnetometer station can be located far enough from the high-voltage power transmission line so that it is not affected by GIC in the high-voltage power transmission line.

Each station of a pair of magnetometer stations can be installed in the vicinity of a substation or transformer. The first, or line, magnetometer station can be installed under a high-voltage power transmission line at least a few hundred meters away from the substation or transformer, particularly, far enough away to reduce electromagnetic noise generated by the substation or transformer. The line magnetometer station can be positioned between two towers where the sag in the power transmission line is largest and the transmission line is approximately horizontal. The reference magnetometer station can be installed from a few hundred meters to a kilometer or further away from the line station, at least far enough away not to be affected by the magnetic signal from GIC flowing along the line. The reference station can also be positioned at least a few hundred meters or more away from the substation or transformer and far enough away to reduce electromagnetic noise from the substation or nearby transmission lines.

The first magnetometer station and the reference magnetometer station can comprise transmitters for transmitting signals pertaining to GIC measurements, to a central processing station. The transmitters can comprise cell modems. The transmitters can be configured to send the signals over a cell phone network, over a satellite network, or over a hybrid network that combines a cell phone network and a satellite network. Different magnetometer stations can send the signals over different wireless networks. A processor can be used at a station so that the transmitter can transmit a processed signal, or raw data signals can be received by the central processing station and processed at the central processing station, for example, by a processor.

Regardless of where it is located, the processor can be part of an autonomous system and can be used to subtract the natural field measurement from the GIC line measurement to obtain a GIC-related Biot-Savart field measurement. The processor or another system component or computer can be used to apply the Biot-Savart law equation to obtain an inversion of the amplitude of the GIC in the high-voltage power transmission line, due to the near space phenomena. The processor or another system component or computer can then be used to convert the inversion, factoring-in distance, height, atmospheric, and other considerations, to obtain the amplitude of the GIC in the high-voltage power transmission line, due to the near space phenomena. Application of the Biot-Savart laws is well known in the art of geomagnetic analysis and is exemplified, for example, by U.S. Pat. No. 5,151,649 to Héroux, and U.S. Pat. No. 5,701,259 to Dittrich, both of which patents are incorporated herein in their entireties by reference.

According to various embodiments, the method can further comprise comparing the amplitude of GIC in the high-voltage power transmission line due to the near space phenomena, to a predetermined threshold amplitude. The comparison can be done autonomously. A NASA alarm can be triggered based on the comparison, when the amplitude of GIC in the high-voltage power transmission line, due to the near space phenomena, exceeds the predetermined threshold amplitude. In some embodiments, information pertaining to the amplitude of the GIC in the high-voltage power transmission line, due to the near space phenomena, can be transmitted to NASA headquarters, another government agency, or the like. The information can be also made available for electric companies, other utility companies, other industries, and the like, to use, for example, so they can take preventative measures. In some embodiments, the method can further comprise comparing the amplitude of GIC in the high-voltage power transmission line due to the near space phenomena, to a predetermined threshold amplitude, and triggering a NASA alarm based on the comparison when the amplitude of GIC in the high-voltage power transmission line due to the near space phenomena exceeds the predetermined threshold amplitude. A preventive action can be performed, taken, or otherwise carried out based on a level of the alarm. According to some embodiments, the preventive action can be carried out autonomously. According to some embodiments, the preventive action can be carried out under the control of an operator, for example, with human intervention. For utility companies that have access to the information, the information can be used to take preventive actions such as momentarily disconnecting a transformer, inducing a temporary blackout, preventing an inflow of GIC into a power grid through a neutral-to-ground connection, rescheduling a geophysical mapping activity, a combination thereof, or the like.

The reference magnetometer station can be located far enough away from the high-voltage power transmission line so as not to be substantially affected by the magnetic field generated by the transmission line, but can preferably be close enough to be exposed to substantially the same natural magnetic field and natural field strength that affects the Earth's surface directly underneath the high-voltage power transmission line.

According to various embodiments of the present invention, a method of determining the direction of movement of a near space geomagnetic phenomenon, is provided. The method can comprise determining the amplitude of geomagnetically induced currents (GIC) in high-voltage power transmission lines, due to near space phenomena, at multiple locations, over time. The determined amplitudes of GIC over time, from the multiple locations, can be compared with one another, and the direction of movement of the near space phenomena can be determined based on changes in the determined amplitudes of GIC over time, from the multiple locations. For example, if measured GIC in an Eastern station is decreasing while measured GIC in a Western station is increases, it can be concluded that the near space phenomena generating the GIC in the stations is moving in a Westerly direction. Power stations in the Western portion of, for example, a national power grid, can access the information and be aware of a geomagnetic storm or phenomena heading in their direction. The method can involve NASA triggering one or more local NASA alarm systems based on the direction of movement determined.

The direction of movement of a near space phenomenon, as described above, can be determined by determining at each of a plurality of stations, the amplitude of GIC in a respective high-voltage power transmission line, due to the near space phenomena, by a method as described herein. In an exemplary method, GIC can be measured with a first fluxgate magnetometer at a first magnetometer station under a first high-voltage power transmission line, to obtain a GIC line measurement, and compared to a natural field measurement of GIC measured with a second fluxgate magnetometer at a reference magnetometer station adjacent to but not under the first high-voltage power transmission line. The method can involve obtaining a GIC-related Biot-Savart field measurement, applying the Biot-Savart law equation to obtain an inversion of the GIC amplitude, and converting the inversion to obtain the amplitude of the GIC, due to the near space phenomena, in the first high-voltage power transmission line. Similar steps can be carried out at other high-voltage power transmission line locations to obtain respective amplitudes of GIC, due to the near space phenomena, in the respective high-voltage power transmission lines.

According to various embodiments of the present invention, a system for determining the amplitude of a geomagnetically induced current (GIC) in a high-voltage power transmission line, due to near space phenomena, is provided. The system can comprise a first fluxgate magnetometer located at a first magnetometer station under a high-voltage power transmission line, and a second fluxgate magnetometer located at a reference magnetometer station adjacent to but not under the high-voltage power transmission line. The first fluxgate magnetometer can be configured to measure GIC in the high-voltage power transmission line and to obtain a GIC line measurement. The second fluxgate magnetometer can be configured to measure a natural field of GIC in the vicinity of the high-voltage power transmission line, but without being affected by GIC in the high-voltage power transmission line. The second fluxgate magnetometer can thus obtain a natural field measurement. The system can also comprise a processor configured to subtract the natural field measurement from the GIC line measurement to obtain a GIC-related Biot-Savart field measurement. The processor can further apply the Biot-Savart law equation to obtain an inversion of the GIC amplitude in the high-voltage power transmission line, and to convert the inversion and thus obtain the amplitude of the GIC in the high-voltage power transmission line due to the near space phenomena. An alarm system can be configured to be triggered by the processor based on a comparison of measured amplitude of GIC in the high-voltage power transmission line due to the near space phenomena, when the measured amplitude exceeds one or more predetermined threshold amplitudes. The system can further comprise a transmitter configured to transmit a signal indicative of information pertaining to the amplitude of the GIC in the high-voltage power transmission line, due to the near space phenomena. The system can comprise a receiver configured to receive a signal transmitted from the transmitter, and the receiver can be located at a NASA headquarters, at a plurality of locations, or the like.

In some embodiments, the system can further comprise one or more additional pairs of fluxgate magnetometers. For example, a second pair can be provided whereby a third fluxgate magnetometer can be located at a second magnetometer station under a second, different high-voltage power transmission line. The third fluxgate magnetometer can be configured to measure GIC in the second high-voltage power transmission line and obtain a second GIC line measurement. A fourth fluxgate magnetometer can be located at a second reference magnetometer station adjacent to, but not under, the second high-voltage power transmission line. The fourth fluxgate magnetometer can be configured to measure a natural field of GIC in the vicinity of the second high-voltage power transmission line but without being affected by GIC in the second high-voltage power transmission line. The fourth fluxgate magnetometer can be configured to obtain a second natural field measurement. The system can comprise a second processor configured to subtract the second natural field measurement from the second GIC line measurement to obtain a second GIC-related Biot-Savart field measurement. The same or a different processor can be provided to apply the Biot-Savart law equation to obtain an inversion of the GIC amplitude in the second high-voltage power transmission line, and to convert the inversion to obtain the amplitude of the GIC in the second high-voltage power transmission line due to the near space phenomena. In some cases, one reference magnetometer station can be used as a reference for two or more different line measurement magnetometer stations.

The first processor, the second processor, or a central processor, can be configured to (1) receive signals indicative of the amplitude of the GIC in the high-voltage power transmission line due to the near space phenomena, (2) receive signals indicative of the amplitude of the GIC in the second high-voltage power transmission line due to the near space phenomena, (3) compare the signals received with one another, and (4) determine a direction of movement of the near space phenomena based on the comparison. In an exemplary set-up, the first high-voltage power transmission line can be located along the East coast of the United States, and the second high-voltage power transmission line can be located along the West coast of the United States. In another example, the first high-voltage power transmission line can be located in the Western hemisphere, and the second high-voltage power transmission line can be located in the Eastern hemisphere. In yet another example, the first high-voltage power transmission line can be located in the Northern hemisphere, and the second high-voltage power transmission line can be located in the Southern hemisphere. Multiple high-voltage power transmission lines can be included in the system and monitored, for example, a vast array of tens or hundreds or thousands of such comparative facilities can be located across a nation or the world to determine nationwide or global directions of movement of near space phenomena. The processors and the entire system can be configured to operate autonomously, without human intervention. The simplistic nature of each station enables the use of vast arrays of comparative facilities.

According to various embodiments of the present invention, two or more fluxgate magnetometers can be used to measure GIC. At least a first magnetometer is located or positioned under a high-voltage power transmission line and at least a second magnetometer is located or positioned at a reference station nearby the line. The reference station can be constructed, positioned, or otherwise located far enough from the high-voltage power transmission line so as not to be substantially affected by the magnetic field generated by the transmission line, but in close enough proximity to measure substantially the same natural field naturally occurring in the vicinity. By "substantially affected" what is meant is that the magnetic field strength at the second, reference magnetometer station is no more than 1% greater than or 1% less than the magnetic field strength that would exist at the first magnetometer location under the transmission line but in the complete absence of the transmission line. The reference station allows subtraction of natural field from the line measurement leaving only GIC-related Biot-Savart field allowing inversion of the GIC amplitude. The magnetometer stations are designed autonomous and low-cost allowing large scale application with a large number of measurement locations.

GIC information is of great interest to NASA but can also be of interest to the power transmission industry and other industries. The information obtained by practice of the methods of the present invention can be made available, for example, to utility companies such as power companies. By having access to GIC information, power companies can minimize damage to power transmission equipment by performing, taking, or otherwise carrying out one or more preventive actions. The preventive actions can comprise, for example, momentarily disconnecting transformers, inducing temporary blackouts, or preventing the inflow of GICs into the grid through the neutral-to-ground connection. GIC information can also be useful to geologists that use Earth's magnetic field to determine subterranean rock structures. According to the present invention, the information obtained can be made accessible to and used by geophysicists to know when strong variations arise in the Earth's normal subsurface electric currents. This information can enable geophysicists to know the timing of good conditions for sensing subsurface oil or mineral structures, and in some cases, good conditions to reschedule a mapping. Surveyors can use geomagnetic alerts and predictions obtained from the present invention to schedule or reschedule mapping activities.

Rapidly fluctuating geomagnetic fields can also produce GIC in pipelines, which can cause problems for pipeline engineers. For example, flow meters in a pipeline can transmit erroneous flow information as a result of a spike in GIC and the corrosion rate of the pipeline can be increased. If pipeline engineers can access the GIC information they can be made aware of geomagnetic storms and spikes in GIC and the engineers can avoid incorrectly attempting to balance current and instead can even implement defensive measures.

The ability to detect geomagnetic disturbances and harmful levels of GIC can be used according to the present invention to explain coincidental satellite malfunctions, coincidental shortwave broadcast disruptions, coincidental weather changes, coincidental health problems, coincidental electric grid damage, and coincidental polar lights. According to various embodiments of the present invention, GIC disturbances detected by the system can be compared to threshold values of GIC and when a threshold value is closely approached or exceeded a NASA alarm or warning can be triggered. For example, an autonomous system can periodically compare periodically measured levels of GIC to one or more predetermined or selected threshold values. In some embodiments a surge in GIC can trigger a current-activated switch that in turn triggers a NASA alarm or warning system.

With reference now to the drawings, FIG. 1A is a flow chart showing various method steps involved with determining the amplitude of GIC, due to near space phenomena, in a high-voltage power transmission line, according to various embodiments of the present invention. A comparative method as described herein is used to derive a GIC amplitude attributable to a near space phenomenon.

Figure 1B:
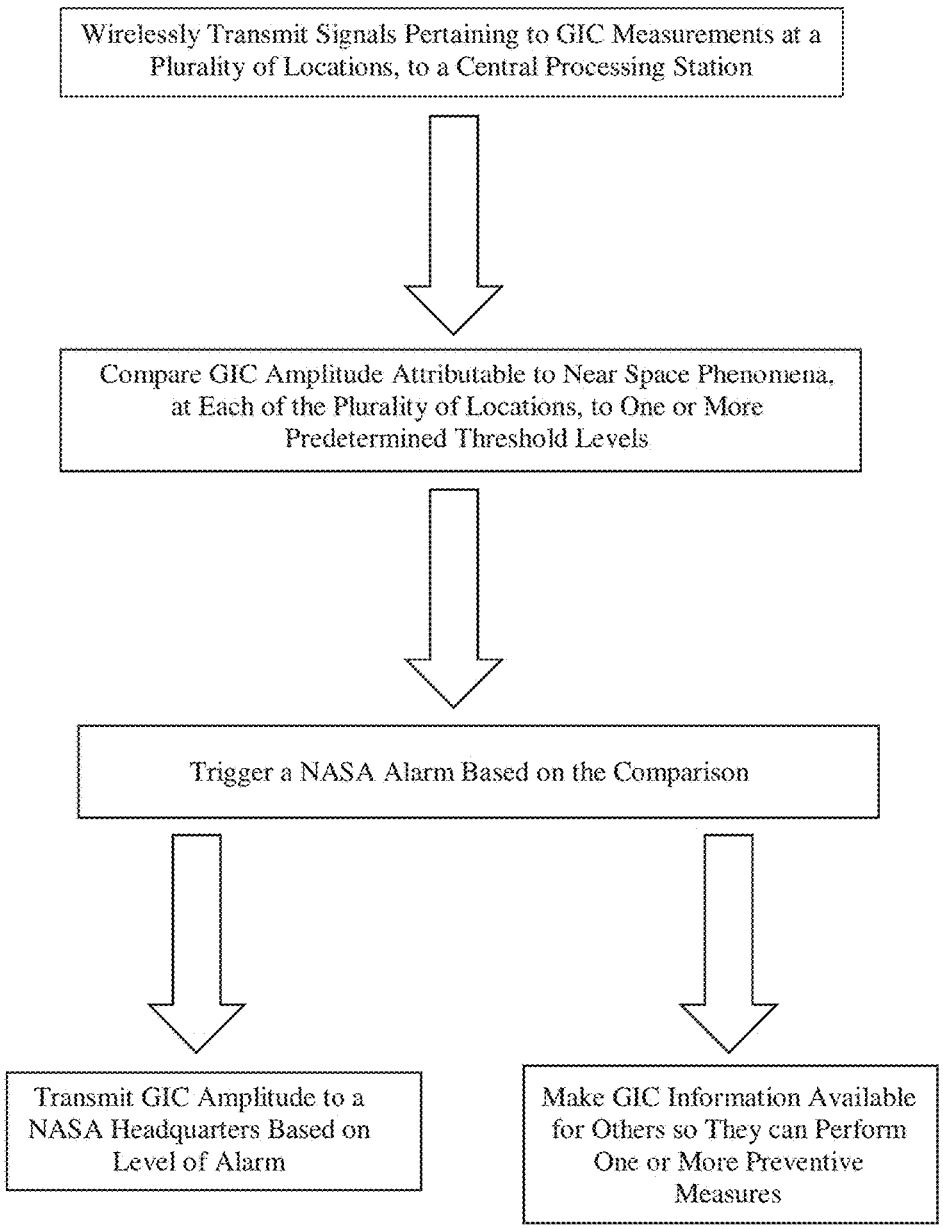
FIG. 1B is a flow chart showing two alternative actions that can be taken, in accordance with the present invention, in the event of an alarm-triggering condition, wherein the GIC amplitude can be determined in accordance with the method depicted in FIG. 1A.

FIG. 1B is a flow chart showing two alternative actions that can be taken, in accordance with the present invention, in the event of a NASA alarm-triggering condition. The GIC amplitude attributable to a near space phenomenon can be determined in accordance with the method depicted in FIG. 1A. The different actions can entail triggering local NASA alarms, performing preventive actions, a combination thereof, or the like.

Figure 1C:
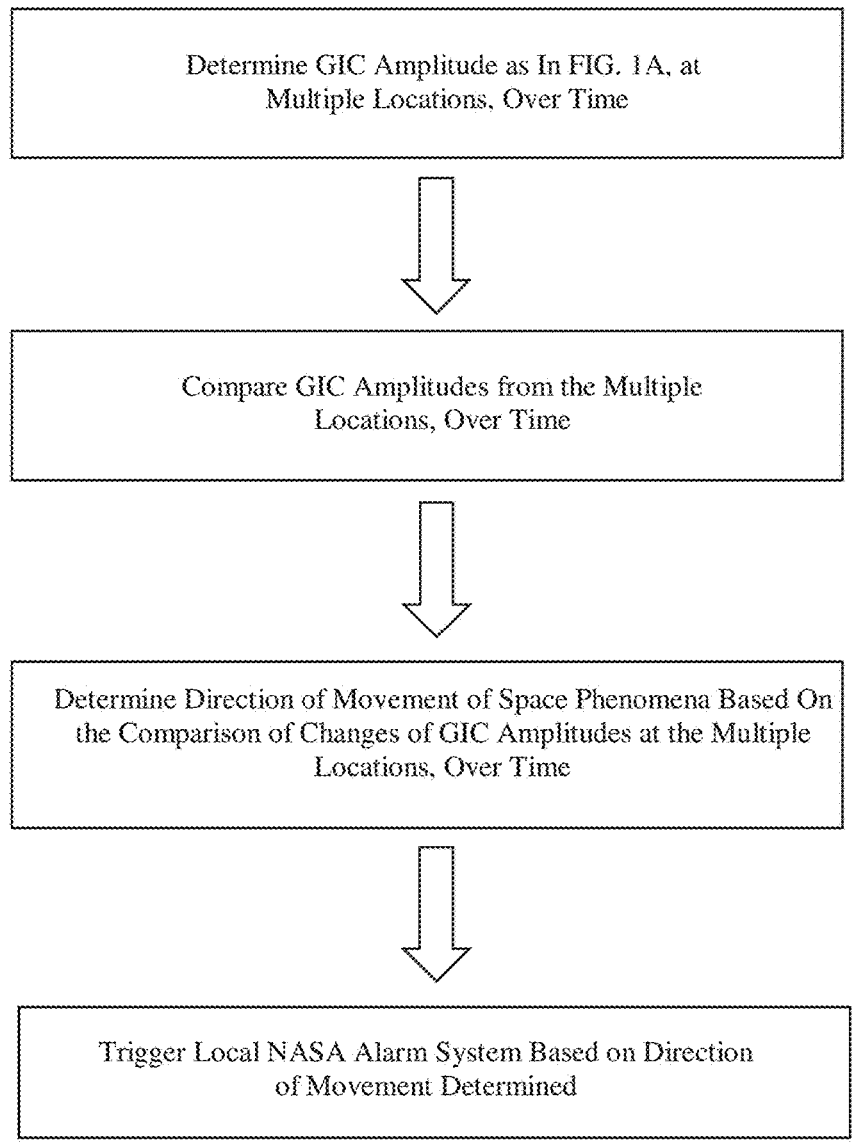
FIG. 1C is a flow chart method steps involved with triggering a local alarm system, in accordance with the present invention, beginning with determining a GIC amplitude by the method depicted in FIG. 1A, at multiple locations.

FIG. 1C is a flow chart method steps involved with triggering a local NASA alarm system, in accordance with the present invention, beginning with determining a GIC amplitude attributable to a near space phenomenon, according to the method depicted in FIG. 1A, at multiple locations. By comparing increases and decreases in GIC amplitude, and strengths of GIC amplitudes, at different locations, spatiometric and directional information about a near space phenomenon can be used to predict GIC surges in different locals. A national or global NASA network can use such information to prepare for GIC surges, perform preventive actions, and explain natural, biological, geophysical, optical, and temporal phenomena.

Figure 2:
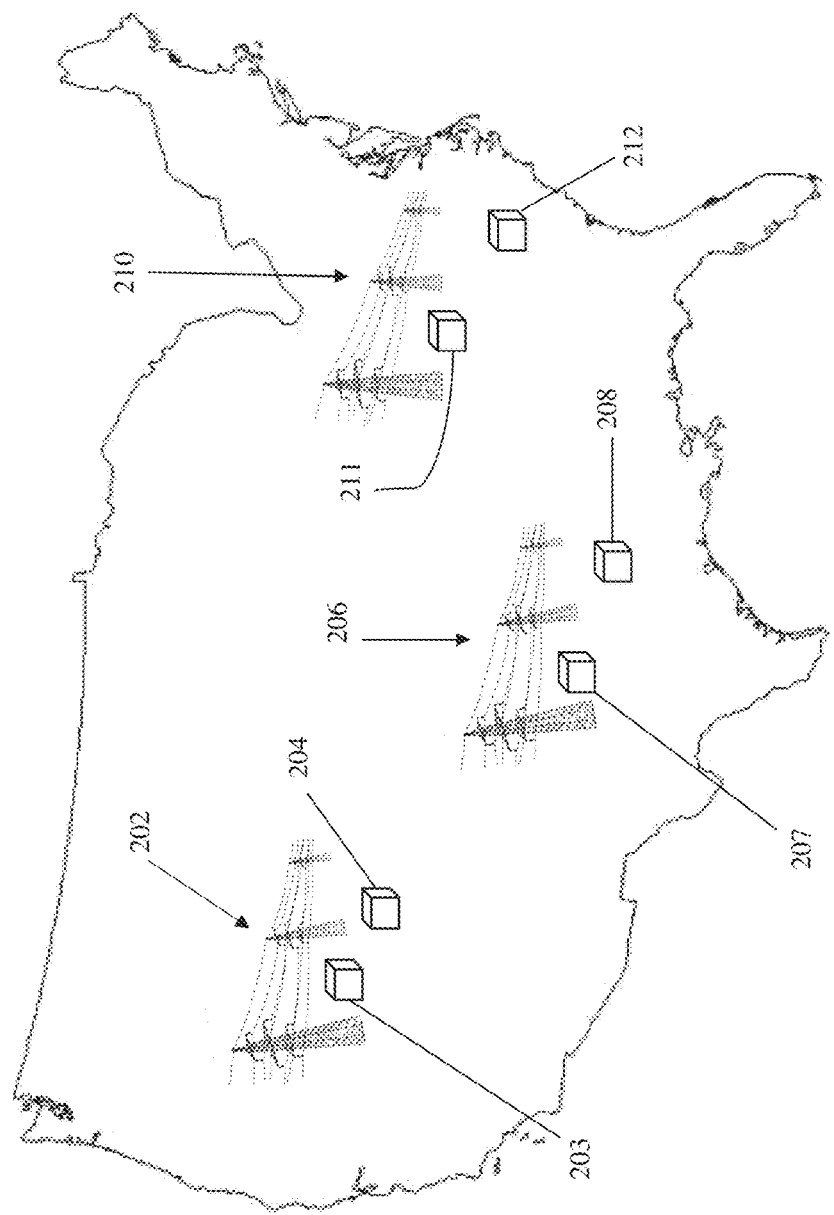
FIG. 2 is a schematic diagram of three sections of a high-voltage power transmission system across the lower 48 continental United States of America, GIC measurements from which can be transmitted to a central processor for determining spatiotemporal space, physical, and geological information.

FIG. 2 is a schematic diagram of three sections of a high-voltage power transmission system, e.g., a power grid, across the lower 48 continental United States of America, GIC measurements from which can be transmitted to a central processor for determining spatiotemporal space, physical, and geological information. A measured increase in GIC amplitude due to a near space phenomenon, along the West coast, that occurs at the same time as a measured decrease in GIC amplitude due to a near space phenomenon, along the East coast, can be indicative of a Westward movement of the near space phenomenon, and, depending upon the measured GIC amplitudes, can trigger NASA alarms.

Figure 3:
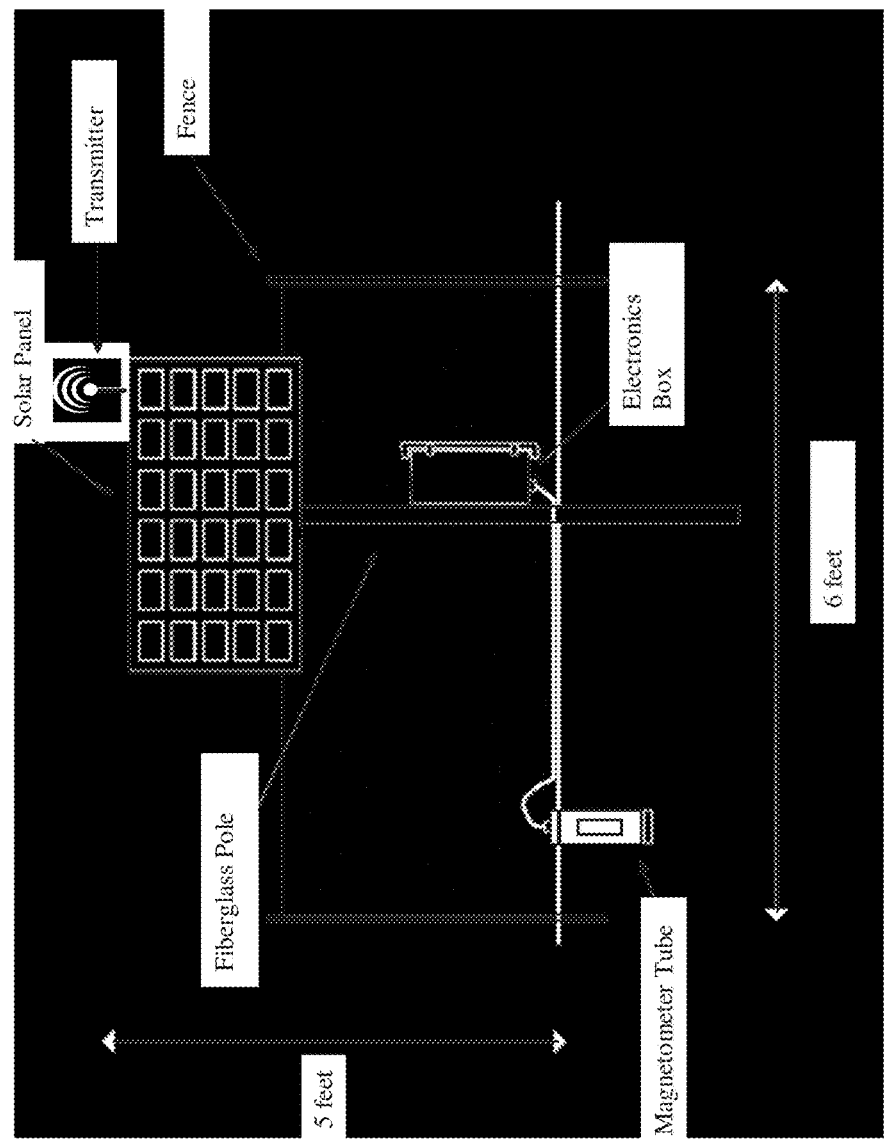
FIG. 3 is a schematic side view of a low-cost, autonomous magnetometer station according to various embodiments of the present invention.

FIG. 3 is a schematic side view of a low-cost, autonomous magnetometer station according to various embodiments of the present invention. The station depicted can be used as a line measurement station or as a reference station and the two types of stations can be identical to one another. The low-cost nature of the station enables the manufacture and distribution of many stations across large areas, for example, dozens, hundreds, or thousands of stations spread across the entirety of a nation, such as the United States. The individual magnetometer station depicted in FIG. 3 comprises a single unit having a footprint of approximately 6-feet by 6-feet. The station can be fully autonomous and require no separate communications links or power supply.

The station can comprise a magnetometer tube, a power supply, a transmitter, and an electronics box. The power supply can comprise a solar panel although other energy supplies, for example, a wind energy supply, can be used. The power supply can comprise or be connected to a battery for storing potential produced by the solar panel. The battery can be configured to power the station at night, or in the absence of wind. The magnetometer tube and the electronics box can be operably connected together by a cable that runs on the ground. The station can be surrounded by a wood, plastic, or chain-link fence, by cement walls, or by another enclosure.

The electronics box can comprise electronics configured to transmit signals or data produced by the station, over a wireless network, to the central processing station. The electronics can comprise a local processor or CPU configured to run software that enables the station to run autonomously. The local processor or CPU can be programmed to periodically transmit signals to the central processing station, to send signals at scheduled times, to send signals when triggered by threshold-exceeding levels of GIC, or a combination thereof. The transmitter can comprise a dish antenna. The power supply can be configured to endlessly supply the entire amount of energy needed to continuously run the station. The software can be used to autonomously control the station and enable autonomous auto-recovery features, reboot features, self-diagnosis features, problem alert features, back-up features, and the like. The electronic box can also comprise a receiver for receiving signals from, for example, the central processing station. The signals received can comprise software updates or requests for status and the local processor or CPU can autonomously install the software updates and send a status report. Exemplary autonomous software, other software, systems, clients, methods, servers, processors, computer-readable media, hardware, and operating environments that can be used include those described, for example, in U.S. Pat. No. 7,627,538 B2, U.S. Pat. No. 7,765,171 B2, U.S. Pat. No. 7,899,760 B2, U.S. Pat. No. 7,904,396 B2, U.S. Pat. No. 7,925,600 B2, U.S. Pat. No. 8,275,724 B2, U.S. Pat. No. 8,537,660 B2, and U.S. Pat. No. 9,026,301 B2, and in U.S. Patent Application Publications Nos. US 2007/0073631 A1, US 2007/0260570 A1, and US 2010/0146635 A1, which are incorporated herein in their entireties by reference.

In the exemplary embodiment shown in FIG. 3, the magnetometer comprises an approximately five-inch diameter, one-foot long magnetometer tube. The magnetometer tube can be buried partially under the ground for thermal and mechanical stability. A polyvinylchloride (PVC) tube can be used to house the magnetometer. The magnetometer tube can be connected to the electronics box using about a 5-foot long length of cable running on the ground. The power supply is shown as a solar panel. The electronics box can house batteries, a cell modem, a micro-controller, a circuit board, an electronics switchboard, various other electronics components, and the like. The cell modem can be mounted on top of the solar panel as can a receiver antenna (not shown). The electronics box can comprise a plastic box and all the electronics can be housed within the plastic box. The electronics box can be mounted to a fiberglass pole and the solar panel powering the station can be mounted to the same or a different fiberglass pole. The pole can have, for example, a two-inch diameter. The total height of the installation can be about six feet or less, for example, about five feet.

Each station can be easily constructed and installed. The installation of the stations can be completed without the need for any additional equipment from the collaborating utility side. A team of installers, for example, a NASA team, can bring with them the various components, a handheld posthole digger, fast-setting concrete, and materials for the fence. The posthole digger can be used to dig two holes having approximately 6-inch diameter. One hole can be about two-feet deep for mounting the pole, and the other hole can be about 10 inches deep for receiving the magnetometer tube. The magnetometer tube can then be placed in the 10-inch deep hole and the pole having the electronics box and solar panel already mounted thereon can be placed in the two-foot deep hole. The magnetometer tube can be surrounded and secured by dirt and the fiberglass pole can be secured with fast-setting concrete. The electronics box can be pre-wired to the magnetometer tube, solar panel, transmitter, and other electronics or the components can be attached or wired together on-site. The station is then ready to be turned on. A barrier, for example, a wood or plastic fence, can then be installed to isolate the station, and the station can be limited to an area of approximately six feet by six feet.

The present invention includes the following numbered aspects, embodiments, and features, in any order and/or in any combination:

1. A method of determining the amplitude of a geomagnetically induced current (GIC) in a high-voltage power transmission line, due to near space phenomena, the method comprising:

measuring GIC with a first fluxgate magnetometer at a first magnetometer station under a high-voltage power transmission line to obtain a GIC line measurement;

measuring GIC with a second fluxgate magnetometer at a reference magnetometer station adjacent to but not under the high-voltage power transmission line to obtain a natural field measurement;

subtracting the natural field measurement from the GIC line measurement to obtain a GIC-related Biot-Savart field measurement;

applying the Biot-Savart law equation to obtain an inversion of the GIC amplitude;

converting the inversion to obtain the amplitude of the GIC in the high-voltage power transmission line due to the near space phenomena; and wirelessly transmitting to a central processing station, via a cell phone network, satellite network, or both, information pertaining to the amplitude of the GIC in the high-voltage power transmission line due to the near space phenomena.

2. The method of any preceding or following embodiment/feature/aspect, wherein the information wirelessly transmitted comprises the GIC line measurement and the natural field measurement, and the subtracting, applying, and converting are carried out by a processor at the central processing station.

3. The method of any preceding or following embodiment/feature/aspect, further comprising:

comparing the amplitude of GIC in the high-voltage power transmission line due to the near space phenomena, to a predetermined threshold amplitude;

triggering a NASA alarm based on the comparison when the amplitude of GIC in the high-voltage power transmission line due to the near space phenomena exceeds the predetermined threshold amplitude; and transmitting information pertaining to the amplitude of the GIC in the high-voltage power transmission line due to the near space phenomena, to a NASA headquarters.

4. The method of any preceding or following embodiment/feature/aspect, further comprising:

comparing the amplitude of GIC in the high-voltage power transmission line due to the near space phenomena, to a predetermined threshold amplitude; and triggering a NASA alarm based on the comparison when the amplitude of GIC in the high-voltage power transmission line due to the near space phenomena exceeds the predetermined threshold amplitude.

5. The method of any preceding or following embodiment/feature/aspect, wherein the reference magnetometer station is located at least one-half mile away from the high-voltage power transmission line and far enough away so that it is not substantially affected by the magnetic field generated by the transmission line.

6. The method of any preceding or following embodiment/feature/aspect, wherein the reference magnetometer station is located at least one-half mile away from the high-voltage power transmission line and far enough away so that it is not substantially affected by the magnetic field generated by the transmission line.

7. A method of determining the direction of movement of near space geomagnetic phenomena, the method comprising:

determining the amplitude of geomagnetically induced currents (GIC) in high-voltage power transmission lines, due to near space phenomena, at multiple locations, over time;

wirelessly transmitting over a cell phone network, a satellite network, or both, information pertaining to the amplitude of GIC, at each of the multiple locations, to a central processing station;

comparing the determined amplitudes of GIC over time, from the multiple locations; and determining a direction of movement of the near space phenomena based on changes in the determined amplitudes of GIC over time, from the multiple locations.

8. The method of any preceding or following embodiment/feature/aspect, wherein the determining is carried out by a processor at a central processing station and the information pertaining to the amplitude of GIC comprises line measurement information and natural field measurement information.

9. The method of any preceding or following embodiment/feature/aspect, further comprising triggering one or more local NASA alarm systems based on the direction of movement determined.

10. The method of any preceding or following embodiment/feature/aspect, wherein the amplitude of GIC in one or more of the high-voltage power transmission lines, due to the near space phenomena, is determined over time by a method comprising:

measuring GIC with a first fluxgate magnetometer at a first magnetometer station under a first of the high-voltage power transmission lines, to obtain a GIC line measurement;

measuring GIC with a second fluxgate magnetometer at a reference magnetometer station adjacent to, but not under, the first high-voltage power transmission line to obtain a natural field measurement;

subtracting the natural field measurement from the line measurement to obtain a GIC-related Biot-Savart field measurement;

applying the Biot-Savart law equation to obtain an inversion of the GIC amplitude; and converting the inversion to obtain the amplitude of the GIC in the first high-voltage power transmission line, due to the near space phenomena.

11. A system for determining the amplitude of a geomagnetically induced current (GIC) in a high-voltage power transmission line, due to near space phenomena, the system comprising:

a first magnetometer station located under a high-voltage power transmission line and comprising a first fluxgate magnetometer and a first transmitter, the first fluxgate magnetometer being configured to measure GIC in the high-voltage power transmission line to obtain a GIC line measurement, the first transmitter being configured to transmit a signal wirelessly over a cell phone network, a satellite network, or both, pertaining to the GIC line measurement;

a reference magnetometer station adjacent to but not under the high-voltage power transmission line, the reference magnetometer station comprising a second fluxgate magnetometer and a second transmitter, the second fluxgate magnetometer being configured to measure a natural field of GIC in the vicinity of the high-voltage power transmission line but without being affected by a magnetic field created by the high-voltage power transmission line, the second fluxgate magnetometer being configured to obtain a natural field measurement, the second transmitter being configured to transmit a signal wirelessly over a cell phone network, a satellite network, or both, pertaining to the natural field measurement; and a central processing station comprising a receiver and a processor, the receiver being configured to receive signals transmitted from the first and second transmitters and communicate the signals to the processor, the processor being configured to subtract the natural field measurement from the GIC line measurement to obtain a GIC-related Biot-Savart field measurement, to apply the Biot-Savart law equation to obtain an inversion of the GIC amplitude in the high-voltage power transmission line, and to convert the inversion to obtain the amplitude of the GIC in the high-voltage power transmission line due to the near space phenomena.

12. The system of any preceding or following embodiment/feature/aspect, further comprising a NASA alarm configured to be triggered by the processor based on a comparison of a measured amplitude of GIC in the high-voltage power transmission line due to the near space phenomena, which exceeds a predetermined threshold amplitude.

13. The system of any preceding or following embodiment/feature/aspect, further comprising:

a second magnetometer station located under a second high-voltage power transmission line and comprising a third fluxgate magnetometer and a third transmitter, the third fluxgate magnetometer being configured to measure GIC in the second high-voltage power transmission line to obtain a second GIC line measurement, the third transmitter being configured to transmit a signal wirelessly over a cell phone network, a satellite network, or both, pertaining to the second GIC line measurement; and a second reference magnetometer station adjacent to but not under the second high-voltage power transmission line, the second reference magnetometer station comprising a fourth fluxgate magnetometer and a fourth transmitter, the fourth fluxgate magnetometer being configured to measure a natural field of GIC in the vicinity of the second high-voltage power transmission line but without being affected by a magnetic field created by the second high-voltage power transmission line, the fourth fluxgate magnetometer being configured to obtain a second natural field measurement, the fourth transmitter being configured to transmit a signal wirelessly over a cell phone network, a satellite network, or both, pertaining to the second natural field measurement;

wherein the receiver is further configured to receive signals transmitted from the third and fourth transmitters and communicate such signals to the processor, and the processor is further configured to subtract the second natural field measurement from the second GIC line measurement to obtain a second GIC-related Biot-Savart field measurement, to apply the Biot-Savart law equation to obtain an inversion of the GIC amplitude in the second high-voltage power transmission line, and to convert the inversion to obtain the amplitude of the GIC in the second high-voltage power transmission line due to the near space phenomena.

14. The system of any preceding or following embodiment/feature/aspect, wherein the processor is further configured to (1) compare the amplitude of the GIC in the high-voltage power transmission line due to the near space phenomena, to the amplitude of the GIC in the second high-voltage power transmission line due to the near space phenomena, and (2) determine a direction of movement of the near space phenomena based on the comparison.

15. The system of any preceding or following embodiment/feature/aspect, wherein the high-voltage power transmission line is located along the East coast of the United States, and the second high-voltage power transmission line is located along the West coast of the United States.

16. The system of any preceding or following embodiment/feature/aspect, further comprising a plurality of additional pairs of magnetometer and reference stations, each additional pair being configured to determine a respective local GIC line measurement, and a respective local natural field measurement, and to wirelessly transmit the respective local measurements to the central processing station.

17. The system of any preceding or following embodiment/feature/aspect, wherein the plurality of additional pairs comprises at least ten additional pairs.

18. The system of any preceding or following embodiment/feature/aspect, wherein each magnetometer station of each additional pair, and each reference station of each additional pair, is configured to operate autonomously such that each station is provided with its own local, solar power, power source and each station is provided with a local processor programmed to automatically transmit signals pertaining to GIC measurements, to the central processing station.

19. An autonomous system for determining the amplitude of a geomagnetically induced current (GIC) in a high-voltage power transmission line, due to near space phenomena, the system comprising:
a first magnetometer station located under a high-voltage power transmission line and comprising a local power supply, a first fluxgate magnetometer, a first transmitter, and a microprocessor programmed to operate the first magnetometer station autonomously, the first fluxgate magnetometer being configured to measure GIC in the high-voltage power transmission line to obtain a GIC line measurement, the first transmitter being configured to transmit a signal wirelessly over a cell phone network, a satellite network, or both, pertaining to the GIC line measurement;
a reference magnetometer station adjacent to but not under the high-voltage power transmission line, the reference magnetometer station comprising a local power supply, a second fluxgate magnetometer, a second transmitter, and a microprocessor programmed to operate the reference station autonomously, the second fluxgate magnetometer being configured to measure a natural field of GIC in the vicinity of the high-voltage power transmission line but without being affected by a magnetic field created by the high-voltage power transmission line, the second fluxgate magnetometer being configured to obtain a natural field measurement, the second transmitter being configured to transmit a signal wirelessly over a cell phone network, a satellite network, or both, pertaining to the natural field measurement; and
a central processing station comprising a receiver and a processor, the receiver being configured to receive signals transmitted from the first and second transmitters and communicate the signals to the processor.

20. The system of any preceding or following embodiment/feature/aspect, wherein the local power supply comprises a solar panel and a battery, and the processor is being configured to subtract the natural field measurement from the GIC line measurement to obtain a GIC-related Biot-Savart field measurement, to apply the Biot-Savart law equation to obtain an inversion of the GIC amplitude in the high-voltage power transmission line, and to convert the inversion to obtain the amplitude of the GIC in the high-voltage power transmission line due to the near space phenomena.

The present invention can include any combination of these various features or embodiments above and/or below as set-forth in sentences and/or paragraphs. Any combination of disclosed features herein is considered part of the present invention and no limitation is intended with respect to combinable features.

The entire contents of all references cited in this disclosure are incorporated herein in their entireties, by reference. Herein, the term "about" means within a range of from plus 5% to minus 5% the value modified. Further, when an amount, concentration, or other value or parameter is given as either a range, preferred range, or a list of upper preferable values and lower preferable values, this is to be understood as specifically disclosing all ranges formed from any pair of any upper range limit or preferred value and any lower range limit or preferred value, regardless of whether such ranges are separately disclosed. Where a range of numerical values is recited herein, unless otherwise stated, the range is intended to include the endpoints thereof, and all integers and fractions within the range. It is not intended that the scope of the invention be limited to the specific values recited when defining a range.

Other embodiments of the present invention will be apparent to those skilled in the art from consideration of the present specification and practice of the present invention disclosed herein. It is intended that the present specification and examples be considered as exemplary only with a true scope and spirit of the invention being indicated by the following claims and equivalents thereof.

What is claimed is:

1. A system for determining the amplitude of a geomagnetically induced current (GIC) in a high-voltage power transmission line, due to near space phenomena, the system comprising:
a first magnetometer station located under a high-voltage power transmission line and comprising a first fluxgate magnetometer and a first transmitter, the first fluxgate magnetometer being configured to measure GIC in the high-voltage power transmission line to obtain a GIC line measurement, the first transmitter being configured to transmit a signal wirelessly over a cell phone network, a satellite network, or both, pertaining to the GIC line measurement;
a reference magnetometer station adjacent to but not under the high-voltage power transmission line, the reference magnetometer station comprising a second fluxgate magnetometer and a second transmitter, the second fluxgate magnetometer being configured to measure a natural field of GIC in the vicinity of the high-voltage power transmission line but without being affected by a magnetic field created by the high-voltage power transmission line, the second fluxgate magnetometer being configured to obtain a natural field measurement, the second transmitter being configured to transmit a signal wirelessly over a cell phone network, a satellite network, or both, pertaining to the natural field measurement; and
a central processing station comprising a receiver and a processor, the receiver being configured to receive signals transmitted from the first and second transmitters and communicate the signals to the processor, the processor being configured to subtract the natural field measurement from the GIC line measurement to obtain a GIC-related Biot-Savart field measurement, to apply the Biot-Savart law equation to obtain an inversion of the GIC amplitude in the high-voltage power transmission line, and to convert the inversion to obtain the amplitude of the GIC in the high-voltage power transmission line due to the near space phenomena.

2. The system of claim 1, further comprising an alarm configured to be triggered by the processor based on a comparison of a measured amplitude of GIC in the high-voltage power transmission line due to the near space phenomena, which exceeds a predetermined threshold amplitude.

3. The system of claim 1, further comprising:
a second magnetometer station located under a second high-voltage power transmission line and comprising a third fluxgate magnetometer and a third transmitter, the third fluxgate magnetometer being configured to measure GIC in the second high-voltage power transmission line to obtain a second GIC line measurement, the third transmitter being configured to transmit a signal wirelessly over a cell phone network, a satellite network, or both, pertaining to the second GIC line measurement; and
a second reference magnetometer station adjacent to but not under the second high-voltage power transmission line, the second reference magnetometer station comprising a fourth fluxgate magnetometer and a fourth transmitter, the fourth fluxgate magnetometer being configured to measure a natural field of GIC in the vicinity of the second high-voltage power transmission line but without being affected by a magnetic field created by the second high-voltage power transmission line, the fourth fluxgate magnetometer being configured to obtain a second natural field measurement, the fourth transmitter being configured to transmit a signal wirelessly over a cell phone network, a satellite network, or both, pertaining to the second natural field measurement;
wherein the receiver is further configured to receive signals transmitted from the third and fourth transmitters and communicate such signals to the processor, and the processor is further configured to subtract the second natural field measurement from the second GIC line measurement to obtain a second GIC-related Biot-Savart field measurement, to apply the Biot-Savart law equation to obtain an inversion of the GIC amplitude in the second high-voltage power transmission line, and to convert the inversion to obtain the amplitude of the GIC in the second high-voltage power transmission line due to the near space phenomena.

4. The system of claim 3, wherein the processor is further configured to (1) compare the amplitude of the GIC in the high-voltage power transmission line due to the near space phenomena, to the amplitude of the GIC in the second high-voltage power transmission line due to the near space phenomena, and (2) determine a direction of movement of the near space phenomena based on the comparison.

5. The system of claim 3, wherein the high-voltage power transmission line is located along the East coast of the United States, and the second high-voltage power transmission line is located along the West coast of the United States.

6. The system of claim 3, further comprising a plurality of additional pairs of magnetometer and reference stations, each additional pair being configured to determine a respective local GIC line measurement, and a respective local natural field measurement, and to wirelessly transmit the respective local measurements to the central processing station.

7. The system of claim 6, wherein the plurality of additional pairs comprises at least ten additional pairs.

8. The system of claim 6, wherein each magnetometer station of each additional pair, and each reference station of each additional pair, is configured to operate autonomously such that each station is provided with its own local, solar power, power source and each station is provided with a local processor programmed to automatically transmit signals pertaining to GIC measurements, to the central processing station.

9. An autonomous system for determining the amplitude of a geomagnetically induced current (GIC) in a high-voltage power transmission line, due to near space phenomena, the system comprising:
a first magnetometer station located under a high-voltage power transmission line and comprising a local power supply, a first fluxgate magnetometer, a first transmitter, and a microprocessor programmed to operate the first magnetometer station autonomously, the first fluxgate magnetometer being configured to measure GIC in the high-voltage power transmission line to obtain a GIC line measurement, the first transmitter being configured to transmit a signal wirelessly over a cell phone network, a satellite network, or both, pertaining to the GIC line measurement;
a reference magnetometer station adjacent to but not under the high-voltage power transmission line, the reference magnetometer station comprising a local power supply, a second fluxgate magnetometer, a second transmitter, and a microprocessor programmed to operate the reference station autonomously, the second fluxgate magnetometer being configured to measure a natural field of GIC in the vicinity of the high-voltage power transmission line but without being affected by a magnetic field created by the high-voltage power transmission line, the second fluxgate magnetometer being configured to obtain a natural field measurement, the second transmitter being configured to transmit a signal wirelessly over a cell phone network, a satellite network, or both, pertaining to the natural field measurement; and
a central processing station comprising a receiver and a processor, the receiver being configured to receive signals transmitted from the first and second transmitters and communicate the signals to the processor.

10. The autonomous system of claim 9, wherein the local power supply comprises a solar panel and a battery, and the processor is configured to subtract the natural field measurement from the GIC line measurement to obtain a GIC-related Biot-Savart field measurement, to apply the Biot-Savart law equation to obtain an inversion of the GIC amplitude in the high-voltage power transmission line, and to convert the inversion to obtain the amplitude of the GIC in the high-voltage power transmission line due to the near space phenomena.

* * * * *